United States Patent
Ko et al.

(10) Patent No.: US 8,458,843 B2
(45) Date of Patent: Jun. 11, 2013

(54) APPARATUS AND METHODS FOR BRUSH AND PAD CONDITIONING

(75) Inventors: Sen-Hou Ko, Sunnyvale, CA (US); Lakshmanan Karuppiah, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 683 days.

(21) Appl. No.: 12/603,771

(22) Filed: Oct. 22, 2009

(65) Prior Publication Data

US 2011/0094537 A1  Apr. 28, 2011

(51) Int. Cl.
 A46B 13/00 (2006.01)
 B08B 11/00 (2006.01)
(52) U.S. Cl.
 USPC .................................. 15/88.3; 15/77; 15/102
(58) Field of Classification Search
 USPC ........................ 15/77, 88.2, 88.3, 88.4, 102
 See application file for complete search history.

(56) References Cited

U.S. PATENT DOCUMENTS

| | | | |
|---|---|---|---|
| 5,639,311 A | 6/1997 | Holley et al. | |
| 5,745,945 A * | 5/1998 | Manfredi et al. | 15/77 |
| 6,158,448 A | 12/2000 | Bahten et al. | |
| 6,328,640 B1 | 12/2001 | Jones et al. | |
| 2002/0006767 A1 * | 1/2002 | Wang et al. | 451/41 |
| 2009/0075567 A1 | 3/2009 | Wang et al. | |

FOREIGN PATENT DOCUMENTS

| | | |
|---|---|---|
| JP | 20077509749 | 4/2007 |
| KP | 10-2007-0119823 A | 12/2007 |
| KP | 10-2008-0024579 B1 | 3/2008 |

OTHER PUBLICATIONS

PCT International Search Report for Application No. PCT/US2010/046599, mailed Mar. 28, 2011.

* cited by examiner

Primary Examiner — Randall Chin
(74) Attorney, Agent, or Firm — Patterson & Sheridan, LLP

(57) ABSTRACT

A method and apparatus for conditioning a processing surface of a cylindrical roller disposed in a brush box is described. In one embodiment, a brush box is described. The brush box includes a tank having an interior volume and a pair of cylindrical rollers at least partially disposed in the interior volume, each of the cylindrical rollers being rotatable about a respective axis, an actuator assembly coupled to each of the cylindrical rollers to move the respective cylindrical roller between a first position where the cylindrical rollers are in proximity and a second position where the cylindrical rollers are spaced away from each other, and a conditioning device for each of the cylindrical rollers, each conditioning device including a conditioner disposed in the interior volume, the conditioner contacting an outer surface of each of the cylindrical rollers when the rollers are in the second position.

15 Claims, 7 Drawing Sheets

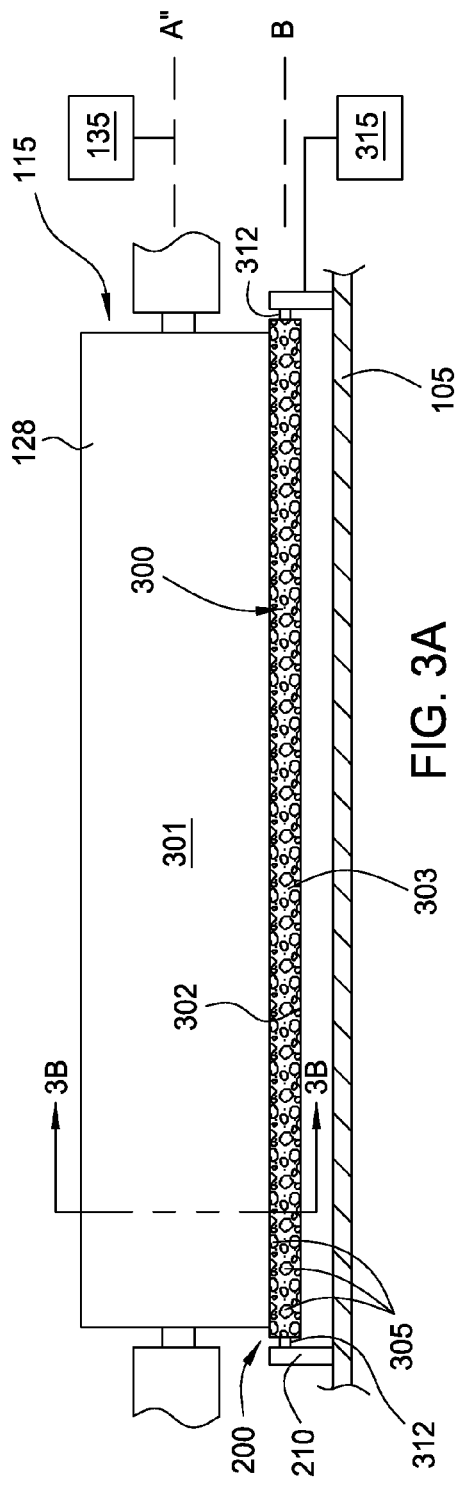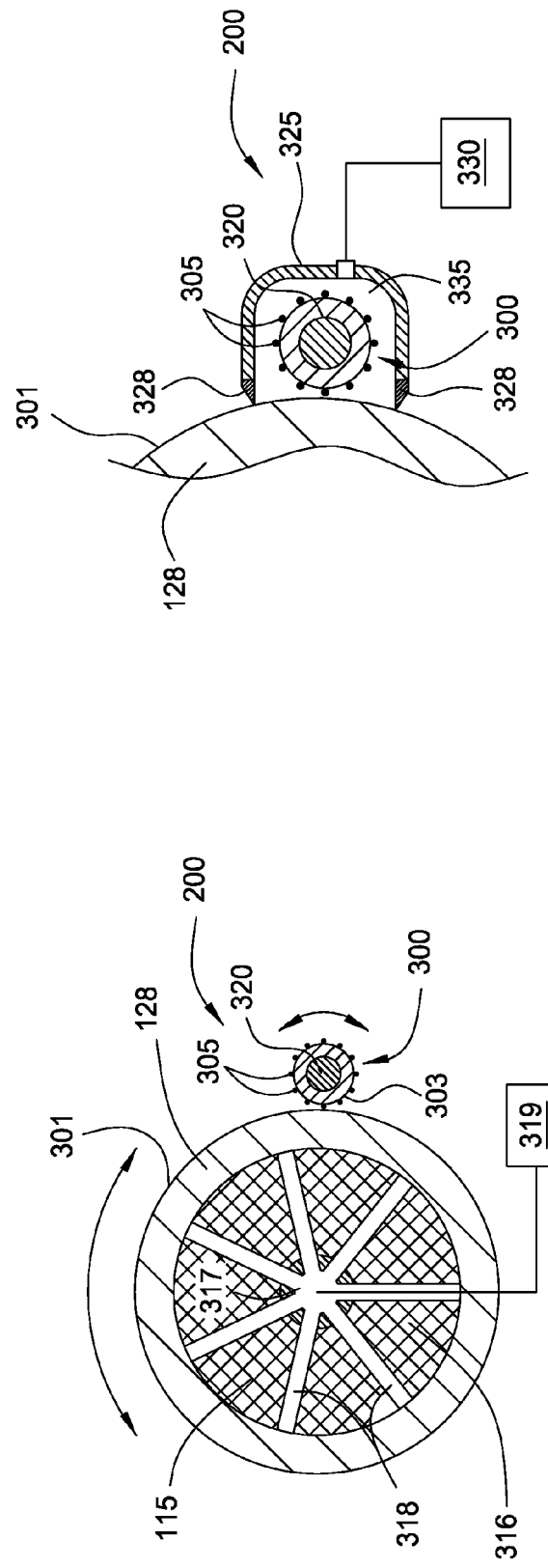

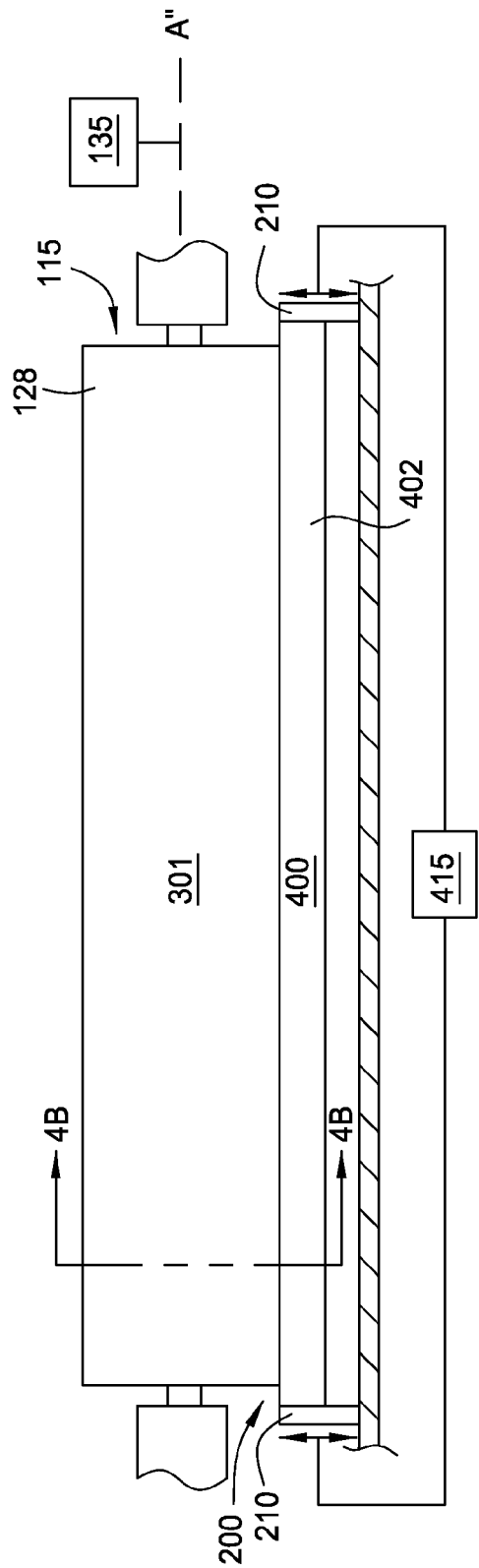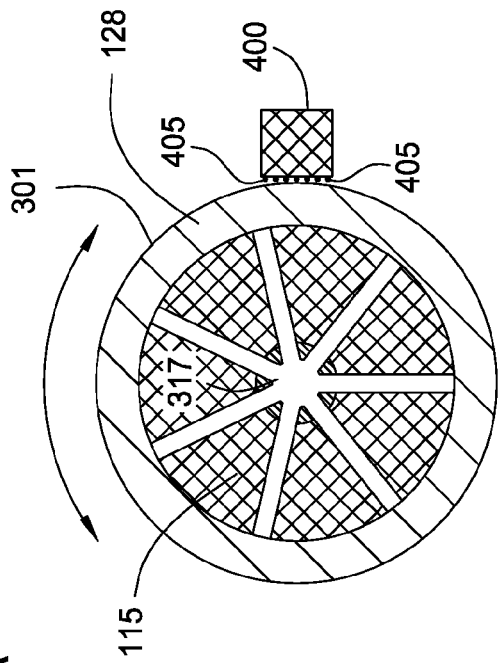

APPARATUS AND METHODS FOR BRUSH AND PAD CONDITIONING

BACKGROUND OF THE INVENTION

1. Field of the Invention

Embodiments of the invention relate to electronic device manufacturing. In particular, embodiments relate to a scrubber box for cleaning and/or polishing thin discs such as semiconductor substrates, wafers, compact discs, glass substrates and the like.

2. Description of the Related Art

Brush cleaning apparatus, sometimes referred to as scrubbers or scrubber boxes, are often utilized to polish and/or clean semiconductor substrates at one or more stages of an electronic device manufacturing process. For example, a cleaning device using cylindrical rollers having a pad material or a brush body disposed thereon may be caused to contact at least one major surface of a substrate to remove material from the major surface of the substrate. In one typical process, a cylindrical roller having a pad material disposed thereon is caused to rotate and urged against a rotating substrate to polish the substrate using a chemical mechanical polishing (CMP) process. In another typical process, a cylindrical roller having a brush body disposed thereon is caused to rotate and urged against a rotating substrate to clean the substrate after a CMP process.

The processing surface of the pad material or brush body disposed on the cylindrical rollers in these devices tend to wear over time, which decreases removal rate or cleaning efficiency. Thus, the pad material or brush bodies may need to be replaced frequently in order to achieve desirable polishing or cleaning results. Replacement of the pad material or brush bodies is costly and causes downtime, which results in higher cost of ownership and lower throughput.

As the demand for integrated circuits continue to rise, chip manufactures have demanded semiconductor process tooling have increased throughput and more robust processing equipment. To meet such demands, apparatus and methods are being developed to maximize throughput, increase the service life of tool components, and decrease the cost of ownership.

What is needed is an apparatus and method for refreshing the processing surface of the pad material or the brush body disposed on the cylindrical rollers to obviate wear of the surface, remove agglomerated materials from the surface, as well as extend the useful lifetime of the pad material or the brush body.

SUMMARY OF THE INVENTION

Embodiments described herein relate to a method and apparatus for conditioning a processing surface of a cylindrical roller disposed in a brush box that is part of a substrate polishing system or a substrate cleaning system. In one embodiment, a brush box is described. The brush box includes a tank having an interior volume and a pair of cylindrical rollers at least partially disposed in the interior volume, each of the cylindrical rollers being rotatable about a respective axis, an actuator assembly coupled to each of the cylindrical rollers to move the respective cylindrical roller between a first position where the cylindrical rollers are in proximity to each other and a second position where the cylindrical rollers are spaced away from each other, and a conditioning device for each of the cylindrical rollers, each conditioning device including a conditioner disposed in the interior volume, the conditioner contacting an outer surface of each of the cylindrical rollers when the rollers are in the second position.

In another embodiment, a brush box is described. The brush box includes a tank having an interior volume and a pair of cylindrical rollers disposed in the interior volume, each of the rollers being rotatable about a respective first axis, an actuator assembly coupled to each of the cylindrical rollers to move the respective roller between a first position where the rollers are in proximity to each other and a second position where the rollers are spaced away from each other, a conditioning device for each of the rollers, each conditioning device including a conditioner disposed in the interior volume, each conditioner contacting an outer surface of each of the cylindrical rollers when the rollers are in the second position, and each conditioner being rotatable about a second axis that is different than the first axis.

In another embodiment, a method for processing a substrate is described. The method includes transferring a substrate to a tank, positioning the substrate between two cylindrical rollers disposed in the tank, moving each of the two cylindrical rollers into a first position where a processing surface of each of the cylindrical rollers contacts major surfaces of the substrate, processing the substrate by providing relative motion between at least one of the two cylindrical rollers and the substrate, moving each of the two cylindrical rollers to a second position that is spaced apart from the major surfaces of the substrate, the second position including contacting the processing surface with a conditioning device, and transferring the substrate out of the tank while conditioning the processing surface.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a top view of one embodiment a conditioning device.

FIG. 3B is a side cross-sectional view of the cylindrical roller and the conditioner of FIG. 3A.

FIG. 3C is a side cross-sectional view of another embodiment of a conditioning device.

FIG. 4A is a top view of another embodiment a conditioning device.

FIG. 4B is a cross-sectional view of the cylindrical roller and the conditioner of FIG. 3A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally provide an apparatus and method for conditioning or refreshing a processing surface of a pad material or a brush body disposed on a cylindrical roller in a brush-type cleaning system that is utilized in a scrubber box. Embodiments of a scrubber box that may be adapted to benefit from the invention include a cleaning module that is part of a SYCAMORE™ polishing system and a DESICA® cleaner, both available from Applied Materials, Inc., located in Santa Clara, Calif. Embodiments described herein may also be utilized on brush-type cleaning and polishing systems available from other manufacturers. Additionally, while the embodiments of scrubber boxes are described to process a substrate in a vertical orientation, some embodiments may be utilized in scrubber boxes configured to process a substrate in a horizontal orientation.

Figure 1:
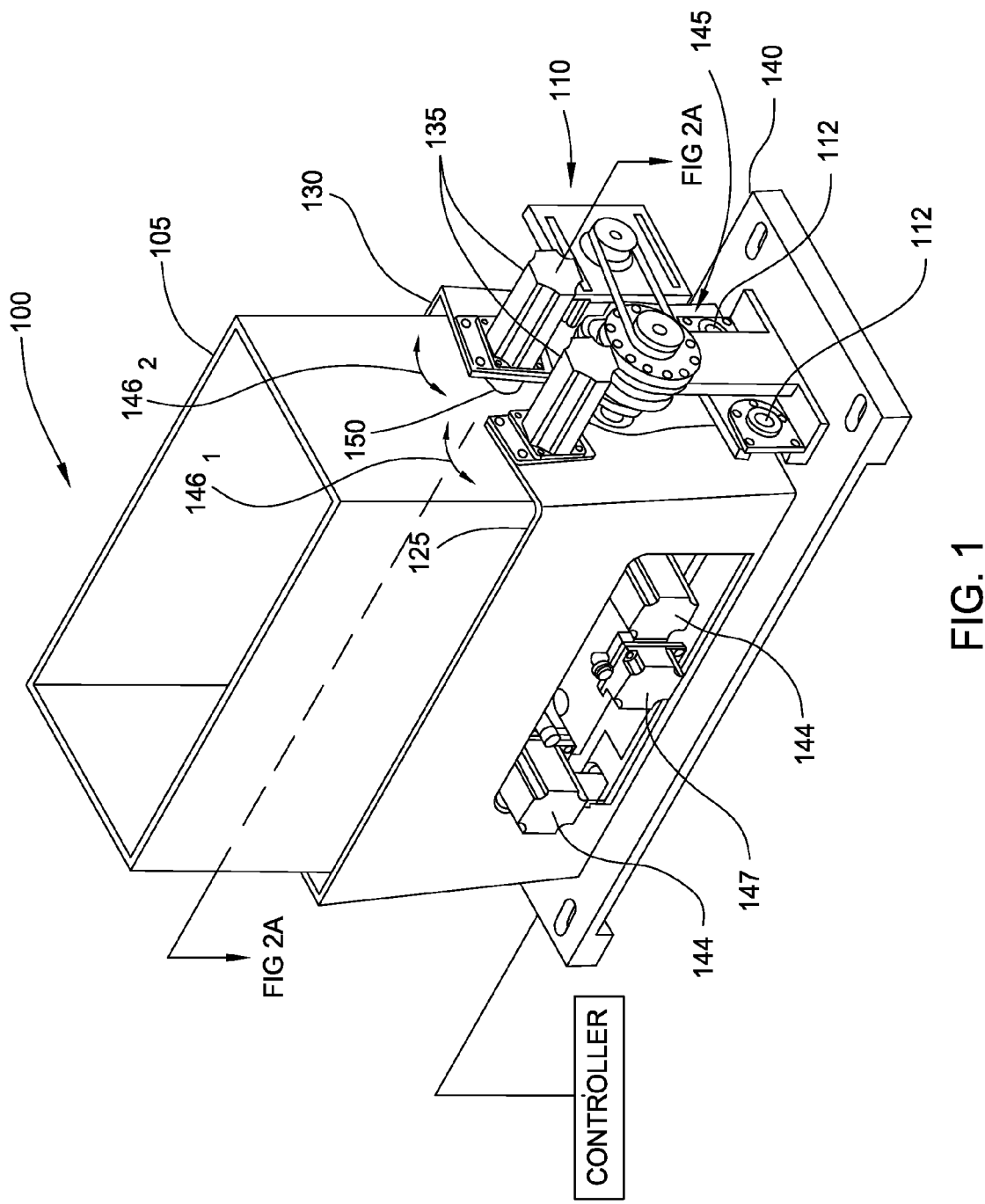
FIG. 1 is an isometric view of a scrubber box.

FIG. 1 is an isometric view of a scrubber box 100 that may be utilized in a cleaning module as described above. The scrubber box 100 includes a tank 105 that is at least partially encased in a first support 125 and a second support 130. Each of the supports 125, 130 are coupled to a linkage 110 that is external to (i.e., outside of) the tank 105 of the scrubber box 100. Each of the supports 125, 130 are adapted to support an actuator 135. Each actuator 135 is coupled to a cylindrical roller 115, 120 (shown in FIG. 2A) located inside the tank 105. The actuators 135 provide rotational movement of the respective cylindrical rollers 115, 120 about axes A' and A". Each of the actuators 135 may be drive motors, such as direct drive servo motors adapted to rotate the respective cylindrical rollers 115, 120 about axes A' and A". Each of the actuators 135 are coupled to a controller adapted to control the rotational speed of the cylindrical rollers 115, 120.

The linkage 110 is coupled to each of the supports 125, 130, a base 140, and an actuator 145. The linkage 110 is utilized for convenient and accurate actuation/movement of the cylindrical rollers 115, 120 located inside the tank 105 relative to the major surfaces of a substrate 101 (shown in FIG. 2A). Additionally, clearance holes (not shown) may be formed in the tank 105 to achieve rotational coupling between the brushes 115, 120, actuators 135 and the supports 125, 130. A compliant coupling element 150, such as a flexible washer, a seal or a bellows, may be disposed around each hole and mounted between the tank 105 and the supports 125, 130. Such an arrangement (1) permits relative motion of the cylindrical rollers 115, 120 relative to the walls of the tank 105; (2) protects the substrate 101 against particulate contamination that might otherwise pass into the interior of the tank 105 through the holes in the tank walls; and/or (3) permits a fluid level in the tank 105 to reach or exceed the level of the holes while preventing fluid from draining therethrough. The actuator 145 is coupled to the controller to control the movement of the linkage 110.

Each of the first and second supports 125, 130 are coupled to the base 140 by a pivot point 112 to which the first and second supports 125, 130 may be adapted to pivot (upward and inward toward one another, and/or downward and outward away from one another). In operation, the first and second supports 125, 130 may be moved simultaneously through respective arcs $146_1$, $146_2$, as shown in FIG. 1, relative to the base 140. Such movement may cause the first and second cylindrical rollers 115, 120 to close against the substrate 101 as shown in FIG. 2A, or to cause the first and second cylindrical rollers 115, 120 to be spaced apart (shown in FIG. 2B) to allow insertion and/or removal of the substrate 101 from the scrubber box 100.

Figure 2A:
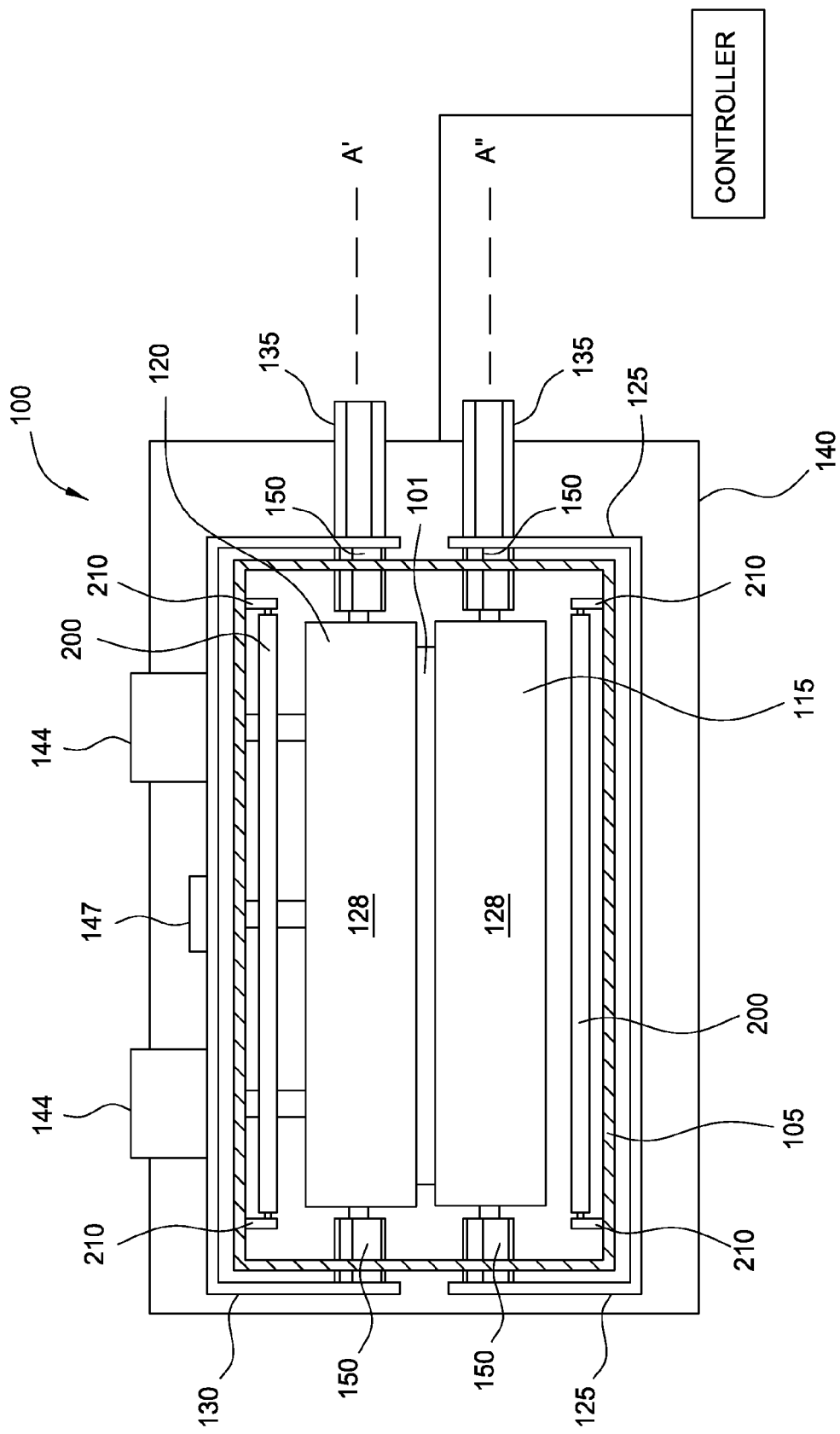
FIG. 2A is a top view of the scrubber box of FIG. 1 showing the cylindrical rollers in a substrate processing position.
Figure 2B:
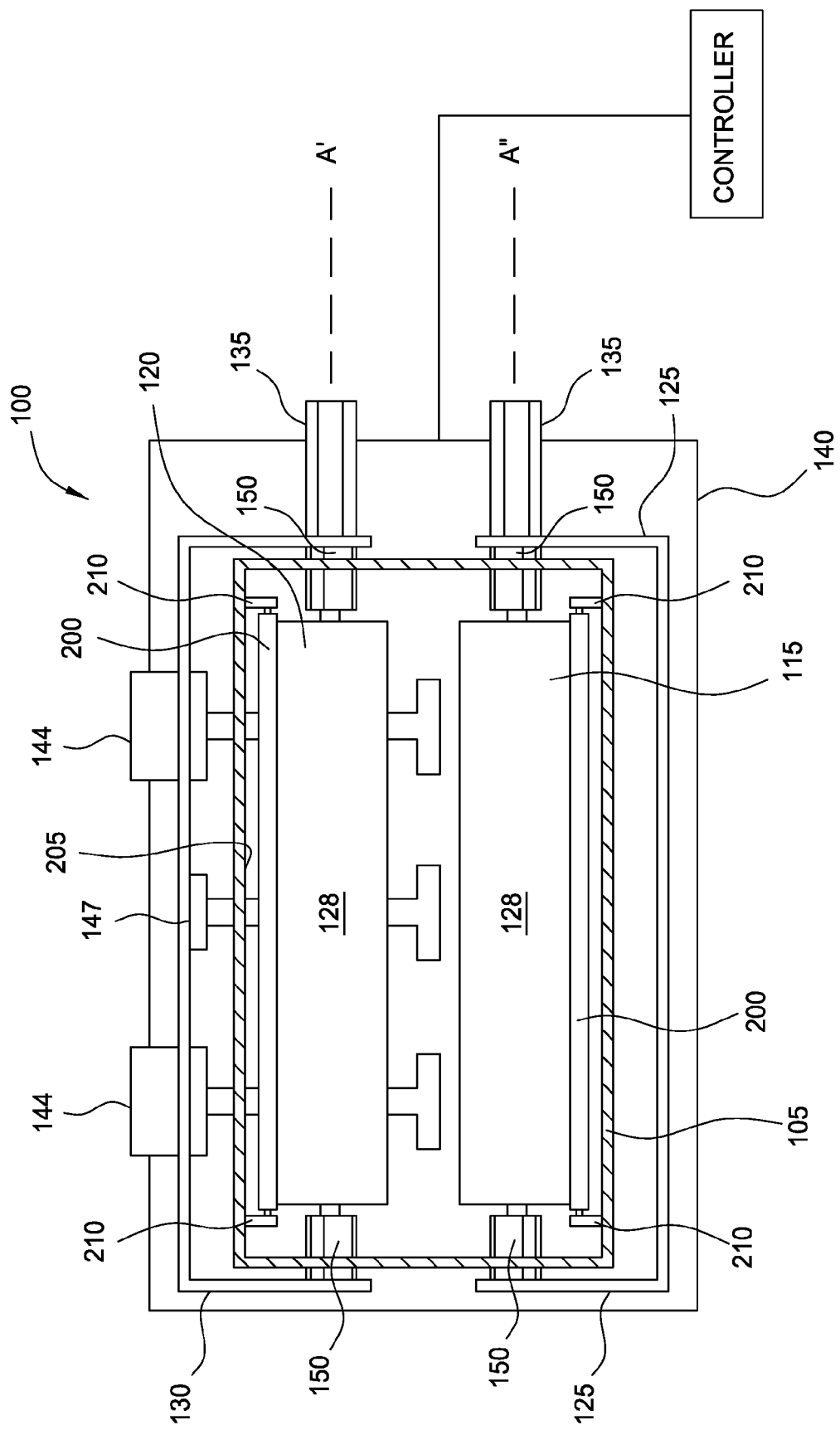
FIG. 2B is a top cross-sectional view of the scrubber box of FIG. 2A showing the cylindrical rollers in a substrate transfer position.

FIG. 2A is a top view of the scrubber box 100 of FIG. 1 showing the cylindrical rollers 115, 120 in a processing position where the cylindrical rollers 115, 120 are closed or pressed against major surfaces of the substrate 101. FIG. 2B is a top view of the scrubber box 100 of FIG. 2A in a transfer position where the cylindrical rollers 115, 120 are spaced apart to facilitate transfer of the substrate. The scrubber box 100 also includes one or more drive motors 144 and a rotational device 147. Each of the drive motors 144 and rotational device 147 are coupled to a roller assembly configured to support and/or engage the substrate 101 and facilitate rotation of the substrate 101.

Each of the cylindrical rollers 115, 120 include a tubular cover 128 disposed thereon. The tubular cover 128 may be a removable sleeve made of a pad material utilized to polish the substrate 101 or a brush body adapted to clean the substrate 101.

Examples of the pad material that may be utilized as the tubular cover 128 include polymeric pad materials typically utilized in chemical mechanical polishing (CMP) processes. The polymeric material may be a polyurethane, a polycarbonate, fluoropolymers, PTFE, PTFA, polyphenylene sulfide (PPS), or combinations thereof. The pad material may further comprise open or closed cell foamed polymers, elastomers, felt, impregnated felt, plastics, and like materials compatible with the processing chemistries. In another embodiment, the pad material is a felt material impregnated with a porous coating.

Examples of a brush body that may be utilized as the tubular cover 128 include polymeric materials, such as foams (e.g., polyvinyl alcohol (PVA), polyurethane) as well as thermoplastic materials or polyamide materials, such as nylon. The tubular cover 128 may further include a plurality of raised features, nodules or bristles (not shown) utilized to abrade the substrate 101 and effect cleaning of the substrate 101.

Depending on the specific material of the tubular cover 128, cleaning and/or polishing effectiveness of the processing surface of the tubular cover 128 is generally dependent on a suitable porosity and average pore size. In some embodiments, the porosity of the processing surface of the tubular cover 128 may be greater than about 85%. Other characteristics of the tubular cover 128 include a desirable average pore size or opening. The pore size opening in some embodiments range from about 10 microns to about 200 microns. The pore structures effect cleaning or material removal from the feature side of the substrate. Attributes such as polishing compound retention, polishing or removal activity, and material and fluid transportation also affect removal rate.

In order to facilitate optimal removal of material from the substrate, these microscopic pores must be fully and evenly open to provide a relatively high and stable removal rate and/or a maximized cleaning efficiency. These pore structures, when open, facilitate material removal by enhancing processing surface wetability, maintaining processing surface roughness, and dispersing polishing compounds, such as, for example, abrasive particles supplied from a polishing compound.

In the process of removing materials from the substrate in the polishing or cleaning process, the processing surface of the tubular cover 128 becomes worn and removed materials, chemicals, and other by products become attached to the processing surface of the tubular cover 128. In order to maintain the cleaning and/or polishing efficiency of the tubular cover 128, the tubular cover 128 may be replaced, which is costly and time consuming. Alternatively, the processing surface of the tubular cover 128 may be periodically conditioned or refreshed to enhance the processing surface of the tubular cover 128

FIGS. 2A and 2B depict one embodiment of a conditioning device 200 that may be utilized to condition and/or refresh the processing surface of the tubular cover 128 disposed on each of the cylindrical rollers 115, 120. In this embodiment, a dedicated conditioning device 200 is provided for each of the cylindrical rollers 115, 120. The conditioning device 200 is mounted adjacent a sidewall 205 of the tank 105 by one or more support members 210. The conditioning device 200 is positioned away from the center of the tank 105 so the conditioning device 200 does not interfere with substrate transfer and/or substrate polishing or cleaning processes. However, the conditioning device 200 is positioned to contact each of the cylindrical rollers 115, 120 when the first and second supports 125, 130 are actuated downward and outward away from one another. In one embodiment, the movement of the first and second supports 125, 130 brings the cylindrical rollers 115, 120 into contact with a respective conditioning device 200. When the cylindrical rollers 115, 120 are in this position, the processing surface of the tubular cover 128 disposed on each of the cylindrical rollers 115, 120 may be conditioned by causing relative movement between the cylindrical rollers 115, 120 and the conditioning device 200.

In one embodiment, the cylindrical rollers 115, 120 rotate about respective first axes A' and A" relative to the conditioning device 200. The rotational direction of axes A' and A" may be the same or different. For example, the rotational direction of a first axis A' and a second axis A" may both be clockwise or counterclockwise. Alternatively, the rotational direction of the first axis A' may be clockwise and the rotational direction of the second axis A" may be counterclockwise, or vice versa. In another embodiment, the conditioning device 200 may be caused to rotate relative to each of the cylindrical rollers 115, 120 based on movement or axial rotation of the cylindrical rollers 115, 120. In another embodiment, both of the conditioning device 200 and the cylindrical rollers 115, 120 may be rotated independently.

The conditioning device 200 is an article configured to clean, abrade or enhance the processing surface of the tubular cover 128 by mechanical contact with the tubular cover 128. In one embodiment, the conditioning device 200 is an abrasive article made of an abrasive material and/or includes abrasive particles such as a diamond or ceramic material. Alternatively, the conditioning device 200 may be made from a material that is harder than the hardness of the processing surface of the tubular cover 128. Examples include glass, silicon materials, thermoplastics, process compatible metals, such as aluminum or tungsten, among other materials. The outer surface of the conditioning device 200 may be roughened to enhance abrasion of the processing surface of the tubular cover 128. In this embodiment, each conditioning device 200 is an elongated cylindrical or tubular member. In other embodiments, each conditioning device 200 may be configured as a flat or cylindrical brush having bristles or a disk-shaped member.

FIG. 3A is a top view of one embodiment a conditioning device 200 having a conditioner 300 in contact with a processing surface 301 of a tubular cover 128 disposed on a cylindrical roller 115. In this embodiment, the conditioner 300 is in the form of a cylindrical rod or tube 302. In one embodiment, the conditioner 300 includes a roughened outer surface 303 adapted to abrade the processing surface 301 of the tubular cover 128. In one embodiment, the outer surface 303 of the conditioner 300 includes a plurality of abrasive particles 305.

In this embodiment, the conditioner 300 is adapted to rotate relative to the cylindrical roller 115. The conditioner 300 is coupled to support members 210 on each end by a spindle 312. The spindles 312 allow rotation of the conditioner 300 relative to the support members 210 and the cylindrical roller 115. The conditioner 300 may be adapted to rotate based on the rotation of the cylindrical roller 115 or the conditioner 300 may be caused rotate independent of the cylindrical roller 115. In one embodiment, the conditioner 300 is coupled to an actuator 315 that rotates the conditioner 300 about an axis B, which may be referred to as a third axis B. In one embodiment, the conditioner 300 may be rotated while the cylindrical roller 115 is stationary. In another embodiment, the conditioner 300 may be rotated about axis B while the cylindrical roller 115 is rotated about axis A". In one aspect, the rotational axes A" and B are substantially parallel. In one embodiment, the rotational direction of axes A' and A" may both be clockwise or counterclockwise. Alternatively, the rotational direction of axis A' may be clockwise and the rotational direction of axis A" may be counterclockwise, or vice versa. In another embodiment, the rotational direction of axis B may be clockwise or counterclockwise and the rotational movement may be independent of the rotation of the cylindrical rollers 115, 120. In yet another embodiment, rotational force to any or all of the cylindrical rollers 115, 120 and the conditioner 300 may be pulsed on and off, varied to change the rotational speed, and/or intermittently reversed.

FIG. 3B is a cross-sectional view of the cylindrical roller 115 and the conditioner 300 of FIG. 3A. The conditioner 300 includes a core 320, which may be a shaft disposed on the longitudinal axis of the conditioner 300. The core 320 may be coupled to the spindles 312 (FIG. 3A). The cylindrical roller 115 includes a mandrel assembly 316 that includes tubular core 317 on the longitudinal axis of the cylindrical roller 115. The tubular core 317 is in communication with a plurality of radial conduits 318 extending from the tubular core 317 to a periphery of the cylindrical roller 115. In one embodiment, the tubular core 317 is coupled to a fluid source 319 that provides a cleaning or polishing fluid to the tubular cover 128 through the radial conduits 318 during processing of a substrate. In another embodiment, the fluid source 319 provides a fluid to the tubular cover 128 during conditioning to enhance cleaning of the processing surface 301. In this embodiment, the fluid source 319 provides a liquid or a gas to the tubular cover 128 through the radial conduits 318. In one embodiment, the fluid may be deionized water (DIW), inert gases such as argon, nitrogen, helium, among other fluids that may facilitate removal of material from the processing surface 301.

FIG. 3C is a side cross-sectional view of another embodiment of a conditioning device 200 having a housing 325 that encloses or surrounds at least a portion of the conditioner 300. The housing 325 includes wipers 328 that are adapted to contact the processing surface 301 of the tubular cover 128. In one embodiment, the wipers 328 include bristles and/or abrasives (not shown) that are utilized to abrade the processing surface 301. In this embodiment, the wipers 328 may be utilized with or without the conditioner 300. For example, in one embodiment, the wipers 328 may be utilized as a conditioning device without the need for the conditioner 300. In another embodiment, the wipers 328 are utilized with the conditioner 300 to contain any materials produced by the conditioning process. In this embodiment, the wipers 328 are made of a flexible or compliant material adapted to conform to the topography of the processing surface 301 of the tubular cover 128. Depending on the use of the wipers 328 with or without the conditioner 300, materials for the wipers 328 include rigid materials such as ceramics, glass, thermoplastics as well as more compliant materials, such as polymers, plastics, silicon, elastomers and rubber.

In one embodiment, the housing 325 encloses a negative pressure region 335. In this embodiment, the housing 325 is in fluid communication with a vacuum pump 330 adapted to generate or maintain negative pressure in the region 335. In this embodiment, the wipers 328 are configured as compliant seals to contain negative pressure within the housing 325. Cleaning of the processing surface 301 may be enhanced by suction from the vacuum pump 330. Material removed from the processing surface 301 of the tubular cover 128 as well as any fluids may be removed from the interior of the housing 325 and routed to a waste or abatement system.

FIG. 4A is a top view of another embodiment a conditioning device 200 having a conditioner 400 in contact with a processing surface 301 of a tubular cover 128 disposed on a cylindrical roller 115. In this embodiment, the conditioner 400 is configured as a brush or comb having a bar-shaped structural member 402 that spans the length of the cylindrical roller 115. Each end of the structural member 402 is coupled to a support member 210. In this embodiment, one or both of the support members 210 are coupled to a linear actuator 415 adapted to provide pressure to one or both ends of the structural member 402. In this manner, a pressure or force between the conditioner 400 and the processing surface 301 of the tubular cover 128 may be varied. In operation, the cylindrical roller 115 is rotated about axis A" while the conditioner 400 is controllably urged against the processing surface 301 of the tubular cover 128.

FIG. 4B is a cross-sectional view of the cylindrical roller 115 and the conditioner 400 of FIG. 3A. In one embodiment, the conditioner 400 includes a plurality of raised features 405 that may be bristles, abrasive particles, structural protrusions, or combinations thereof. While not shown, the conditioner 400 may be enclosed by a housing that is in communication with a vacuum pump as shown in FIG. 3C.

Figure 5A:
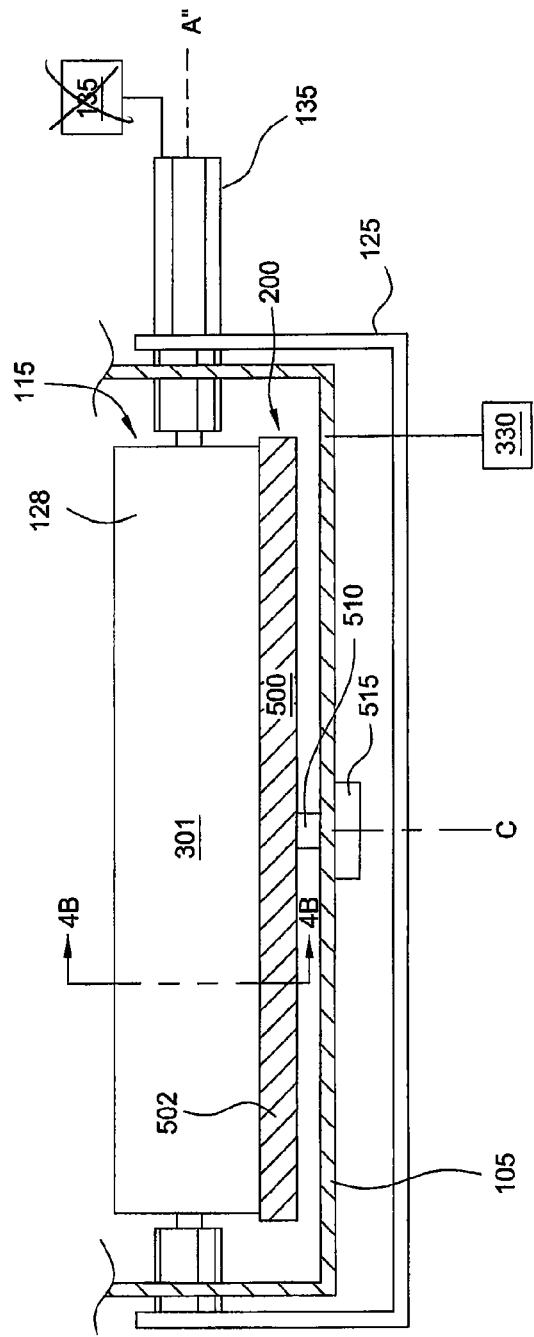
FIG. 5A is a top view of another embodiment a conditioning device.

FIG. 5A is a top view of another embodiment a conditioning device 200 having a conditioner 500 in contact with a processing surface 301 of a tubular cover 128 disposed on a cylindrical roller 115. In this embodiment, the conditioner 500 includes a disk-shaped body 502 coupled to a support member 510 at a geometric center of the body 502. In this embodiment, the support member 510 is adapted as an axle that is coupled to an actuator 515 utilized to rotate the body 502 about axis C. In this embodiment, the tank 105 may be provided with a lid (not shown) to allow the interior volume of the tank 105 to contain negative pressure provided by a vacuum pump 330. As the material is removed from the processing surface 301 of the tubular cover 128, the removed materials, as well as any fluids, may be removed from the interior of the tank 105 and routed to a waste or abatement system.

Figure 5B:
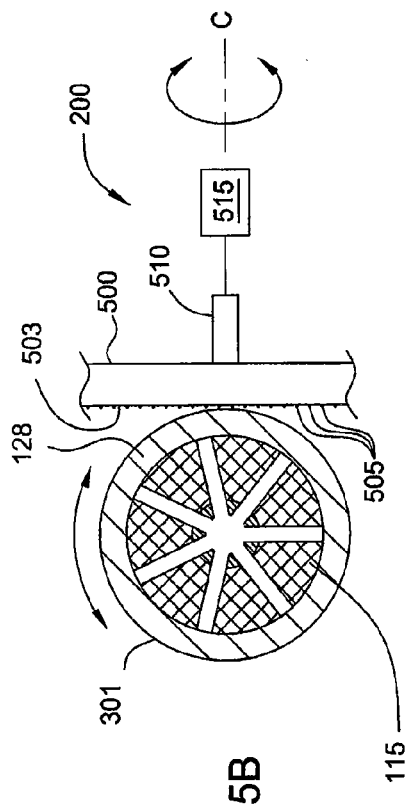
FIG. 5B is a cross-sectional view of the cylindrical roller and the conditioner of FIG. 5A.

FIG. 5B is a cross-sectional view of the cylindrical roller 115 and the conditioner 500 of FIG. 5A. The conditioner 500 includes an outer surface 503 that may be roughened in order to abrade the processing surface 301 of the tubular cover 128. In one embodiment, the outer surface 503 includes a plurality of raised features 505 that may be bristles, abrasive particles, structural protrusions, or combinations thereof.

In this embodiment, the conditioner 500 is adapted to rotate relative to the cylindrical roller 115. The conditioner 500 is coupled to the support member 510 to facilitate rotation of the body 502 relative to the cylindrical roller 115. The conditioner 500 may be adapted to rotate based on the rotation of the cylindrical roller 115 or the conditioner 500 may be caused rotate independent of the cylindrical roller 115. In one embodiment, the conditioner 500 is coupled to the actuator 515 that rotates the body 502 about axis C, which may be referred to as a fourth axis C. In one embodiment, the body 502 may be rotated while the cylindrical roller 115 is stationary. In another embodiment, the body 502 may be rotated about axis C while the cylindrical roller 115 is rotated about axis A". In one aspect, the rotational axis A" is substantially normal to the rotational axis C.

Figure 6:
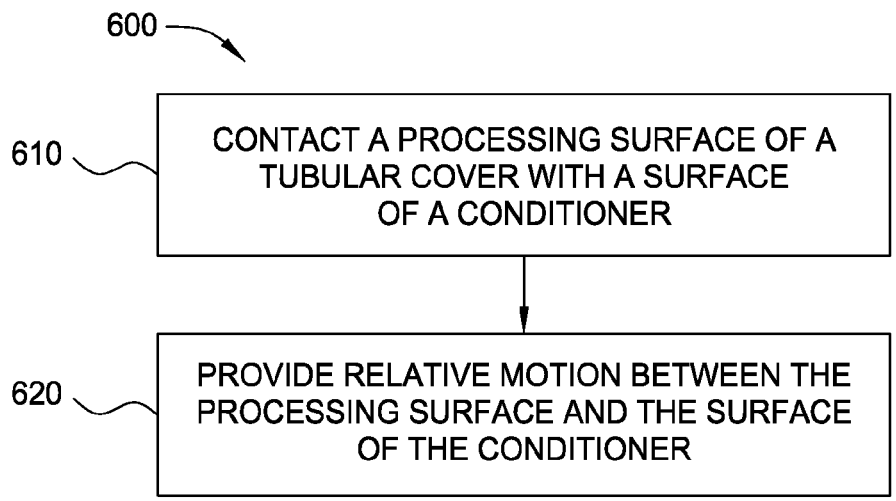
FIG. 6 is a flowchart showing one embodiment of a conditioning method.

FIG. 6 is a flowchart showing one embodiment of a conditioning method 600 using the conditioning device 200 as described herein. At 610, one or both of the cylindrical rollers 115, 120 having a processing surface 301 are positioned to contact a conditioner, such as the conditioner 300, 400 or 500 as described herein. At 620, relative motion is provided between the processing surface 301 and the conditioner. The relative motion may be provided by rotating the cylindrical roller 115, 120 relative to the conditioner, rotating the conditioner relative to the cylindrical roller 115, 120, or a combination thereof.

Figure 7:
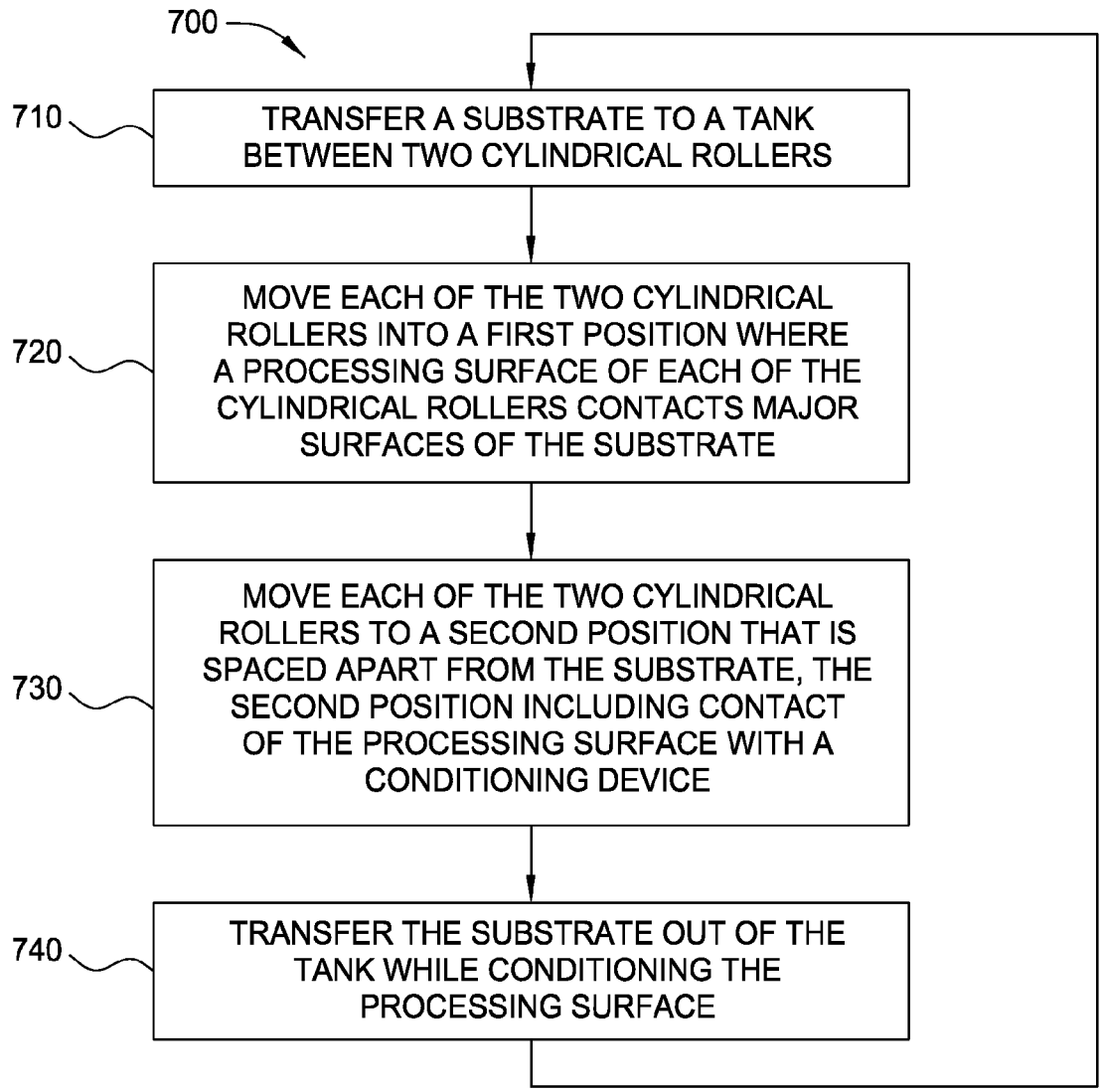
FIG. 7 is a flowchart showing one embodiment of a substrate processing method.

FIG. 7 is a flowchart showing one embodiment of a substrate processing method 700 using the scrubber box 100 as described herein. At 710, a substrate is transferred to a tank 105 to a position between two cylindrical rollers 115, 120. At 720, each of the two cylindrical rollers 115, 120 are urged toward the substrate into a first position that facilitates contact between a processing surface 301 of the cylindrical rollers 115, 120 and major surfaces of the substrate. During step 720, the cylindrical rollers 115, 120 and the substrate may be caused to rotate relative in order to perform a cleaning or polishing process.

At 730, the cylindrical rollers 115, 120 are moved to a second position that spaces the cylindrical rollers 115, 120 away from the substrate to facilitate transfer of the substrate. The second position also includes contacting the processing surface of each of the cylindrical rollers 115, 120 with a conditioning device, which may be the conditioner 300, 400, or 500 as described herein. A conditioning method as described in FIG. 6 may be performed while the substrate is transferred out of the tank 105. The conditioning method may continue until another substrate is transferred into the tank 105 and the method may repeat beginning at step 710.

Embodiments of the conditioning device 200 as described herein extends the lifetime of the processing surface 301 of a tubular cover 128 utilized on the cylindrical rollers 115, 120 of a scrubber box 100. The use of the conditioning device 200 provides in-situ conditioning of the processing surface 301 of the cylindrical rollers 115, 120 such that the cylindrical rollers 115, 120 do not need to be removed from the tank 105. In one embodiment, the processing surface 301 of new or unused tubular covers 128 may be conditioned in a break-in process that is performed in the scrubber box 100. Using the conditioning device 200 in a break-in process minimizes or eliminates the need for dummy wafers and saves time. Additionally, the conditioning of the processing surface 301 of the cylindrical rollers 115, 120 during substrate transfer processes does not affect throughput of the scrubber box 100. The conditioning device 200 as described herein also maintains an optimal processing surface 301 of the tubular cover 128 by opening pores and removing agglomerated and/or excess material from the processing surface 301. The optimal processing surface 301 increases removal rate or cleaning efficiency and minimizes replacement frequency of the tubular cover 128. Thus, cost of ownership is minimized while throughput is maximized.

While the foregoing is directed to embodiments of the invention, other and further embodiments of the invention may be devised without departing from the basic scope thereof.

What is claimed is:

1. A brush box, comprising:
a tank having an interior volume;
a pair of cylindrical rollers coupled at each end thereof to a respective support member disposed outside the interior volume, each of the cylindrical rollers disposed at least partially in the interior volume and being rotatable about a respective axis;
an actuator assembly coupled to each of the cylindrical rollers to move the respective cylindrical roller between a first position where the cylindrical rollers are in proximity to each other and a second position where the cylindrical rollers are spaced away from each other; and
a conditioning device for each of the cylindrical rollers, each conditioning device including a conditioner disposed in the interior volume, the conditioner contacting an outer surface of each of the cylindrical rollers when the rollers are in the second position, wherein:
the conditioner is rotatably coupled to a sidewall of the tank by one or more support members,
the one or more support members are coupled to an actuator,
the cylindrical rollers are rotatable about a first axis and a second axis, the first axis being different than and parallel to the second axis, and
the actuator rotates the conditioner about a third axis that is substantially normal to the first or the second axis.

2. A brush box, comprising:
a tank having an interior volume;
a pair of cylindrical rollers coupled at each end thereof to a respective support member disposed outside the interior volume, each of the cylindrical rollers disposed at least partially in the interior volume and being rotatable about a respective axis;
an actuator assembly coupled to each of the cylindrical rollers to move the respective cylindrical roller between a first position where the cylindrical rollers are in proximity to each other and a second position where the cylindrical rollers are spaced away from each other; and
a conditioning device for each of the cylindrical rollers, each conditioning device including a conditioner disposed in the interior volume, the conditioner contacting an outer surface of each of the cylindrical rollers when the rollers are in the second position, wherein the conditioner comprises a cylindrical tube.

3. A brush box, comprising:
a tank having an interior volume;
a pair of cylindrical rollers coupled at each end thereof to a respective support member disposed outside the interior volume, each of the cylindrical rollers disposed at least partially in the interior volume and being rotatable about a respective axis;
an actuator assembly coupled to each of the cylindrical rollers to move the respective cylindrical roller between a first position where the cylindrical rollers are in proximity to each other and a second position where the cylindrical rollers are spaced away from each other; and
a conditioning device for each of the cylindrical rollers, each conditioning device including a conditioner disposed in the interior volume, the conditioner contacting an outer surface of each of the cylindrical rollers when the rollers are in the second position, wherein the conditioner comprises a disk.

4. A brush box, comprising:
a tank having an interior volume;
a pair of cylindrical rollers coupled at each end thereof to a respective support member disposed outside the interior volume, each of the cylindrical rollers disposed at least partially in the interior volume and being rotatable about a respective axis;
an actuator assembly coupled to each of the cylindrical rollers to move the respective cylindrical roller between a first position where the cylindrical rollers are in proximity to each other and a second position where the cylindrical rollers are spaced away from each other;
a conditioning device for each of the cylindrical rollers, each conditioning device including a conditioner disposed in the interior volume, the conditioner contacting an outer surface of each of the cylindrical rollers when the rollers are in the second position; and
a housing disposed around the conditioner.

5. The brush box of claim 4, wherein the housing is coupled to a vacuum pump.

6. The brush box of claim 4, wherein the housing includes at least one wiper adapted to contact the outer surface of the cylindrical roller in the second position.

7. A brush box, comprising:
a tank having an interior volume;
a pair of cylindrical rollers coupled at each end thereof to a respective support member movably disposed outside the interior volume, each of the cylindrical rollers disposed at least partially in the interior volume and being rotatable about a respective first axis;
an actuator assembly coupled to each of the cylindrical rollers to move the respective roller between a first position where the rollers are in proximity to each other and a second position where the rollers are spaced away from each other; and
a conditioning device for each of the rollers, each conditioning device including a conditioner disposed in the interior volume, each conditioner contacting an outer surface of each of the cylindrical rollers when the rollers are in the second position, and each conditioner being rotatable about a second axis that is different than the first axis, wherein each conditioner is rotatably coupled to a sidewall of the tank by one or more support members, and the one or more support members are coupled to an actuator that rotates the conditioner about the second axis, the second axis being substantially normal to the first axis.

8. A brush box, comprising:
a tank having an interior volume;
a pair of cylindrical rollers coupled at each end thereof to a respective support member movably disposed outside the interior volume, each of the cylindrical rollers disposed at least partially in the interior volume and being rotatable about a respective first axis;
an actuator assembly coupled to each of the cylindrical rollers to move the respective roller between a first position where the rollers are in proximity to each other and a second position where the rollers are spaced away from each other;
a conditioning device for each of the rollers, each conditioning device including a conditioner disposed in the interior volume, each conditioner contacting an outer surface of each of the cylindrical rollers when the rollers are in the second position, and each conditioner being rotatable about a second axis that is different than the first axis; and
a housing disposed around the conditioner.

9. The brush box of claim 8, wherein the housing is coupled to a vacuum pump.

10. The brush box of claim 8, wherein the housing includes at least one wiper adapted to contact the outer surface of the cylindrical roller in the second position.

11. A brush box, comprising:
- a tank having an interior volume;
- a pair of cylindrical rollers coupled to a respective support member movably disposed outside the interior volume, each of the cylindrical rollers disposed at least partially in the interior volume and being rotatable about a respective first axis;
- an actuator assembly coupled to each of the cylindrical rollers to move the respective roller between a first position where the rollers are in proximity to each other and a second position where the rollers are spaced away from each other; and
- a conditioning device for each of the rollers, each conditioning device including a conditioner disposed in the interior volume, each conditioner contacting an outer surface of each of the cylindrical rollers when the rollers are in the second position, and each conditioner being rotatable about a second axis that is different than the first axis, wherein each conditioner is rotatably coupled to a sidewall of the tank by one or more support members that are coupled to an actuator, and wherein the actuator rotates the conditioner about the second axis, the second axis being substantially normal to the first axis.

12. The brush box of claim 11, wherein each conditioner comprises a cylindrical tube.

13. The brush box of claim 11, wherein the conditioner comprises a bar.

14. The brush box of claim 11, wherein the conditioner comprises a disk.

15. The brush box of claim 11, wherein the conditioning device further comprises a housing disposed around the conditioner.

* * * * *